United States Patent
Zhang et al.

(10) Patent No.: US 6,992,405 B2
(45) Date of Patent: Jan. 31, 2006

(54) DYNAMIC VOLTAGE SCALING SCHEME FOR AN ON-DIE VOLTAGE DIFFERENTIATOR DESIGN

(75) Inventors: Kevin X. Zhang, Portland, OR (US); Liqiong Wei, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 560 days.

(21) Appl. No.: 10/095,973

(22) Filed: Mar. 11, 2002

(65) Prior Publication Data

US 2003/0168915 A1  Sep. 11, 2003

(51) Int. Cl.
*H01H 3/26* (2006.01)

(52) U.S. Cl. .................. 307/140; 307/125; 307/126
(58) Field of Classification Search ............ 307/140, 307/125, 126
See application file for complete search history.

(56) References Cited

U.S. PATENT DOCUMENTS

| | | | |
|---|---|---|---|
| 5,336,986 A | | 8/1994 | Allman |
| 5,570,004 A | * | 10/1996 | Shibata ................. 323/303 |
| 5,778,237 A | | 7/1998 | Yamamoto et al. |
| 6,078,539 A | * | 6/2000 | Dvir ..................... 365/226 |
| 6,289,465 B1 | | 9/2001 | Kuemerle |
| 6,512,289 B1 | * | 1/2003 | Elward .................. 257/691 |
| 6,566,848 B2 | * | 5/2003 | Horigan et al. ........ 323/283 |

OTHER PUBLICATIONS

PCT Search Report, PCT/US03/04796, mailed Mar. 5, 2004.
IBM Technical Disclosure Bulletin, vol. 32 No. 2 Jul. 1989, XP000033327, "On-Chip Reference Voltage Regulator", pp. 26-27.

* cited by examiner

*Primary Examiner*—Robert L. DeBerandinis
(74) *Attorney, Agent, or Firm*—Blakely, Sokoloff, Taylor & Zafman LLP

(57) ABSTRACT

According to one embodiment, an integrated circuit is disclosed. The integrated circuit includes a plurality of circuit blocks. Each circuit block includes a voltage differentiator that generates a local supply for the circuit block.

23 Claims, 5 Drawing Sheets

DYNAMIC VOLTAGE SCALING SCHEME FOR AN ON-DIE VOLTAGE DIFFERENTIATOR DESIGN

COPYRIGHT NOTICE

Contained herein is material that is subject to copyright protection. The copyright owner has no objection to the facsimile reproduction of the patent disclosure by any person as it appears in the Patent and Trademark Office patent files or records, but otherwise reserves all rights to the copyright whatsoever.

FIELD OF THE INVENTION

The present invention relates to integrated circuits; more particularly, the present invention relates to generating multiple power supply voltages on an integrated circuit.

BACKGROUND

Recently, power consumption has become an important concern for high performance computer systems. Consequently, low power designs have become significant for present-day very large scale integration (VLSI) systems. The most effective way to reduce power dissipation in an integrated circuit (IC) is by decreasing the power supply voltage ($V_{CC}$) at the IC.

In order to simultaneously achieve high performance and low power, multi-$V_{CC}$ design, various techniques have been developed. However, due to the high cost of packaging and routing, it is typically difficult to generate multi-$V_{CC}$ designs using traditional off-chip voltage regulators.

BRIEF DESCRIPTION OF THE DRAWINGS

The present invention will be understood more fully from the detailed description given below and from the accompanying drawings of various embodiments of the invention. The drawings, however, should not be taken to limit the invention to the specific embodiments, but are for explanation and understanding only.

DETAILED DESCRIPTION

A mechanism to dynamically scale voltage at one or more circuit blocks on an integrated circuit (IC) using on-die voltage differentiators is described. In the following description, numerous details are set forth. It will be apparent, however, to one skilled in the art, that the present invention may be practiced without these specific details. In other instances, well-known structures and devices are shown in block diagram form, rather than in detail, in order to avoid obscuring the present invention.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Figure 1:
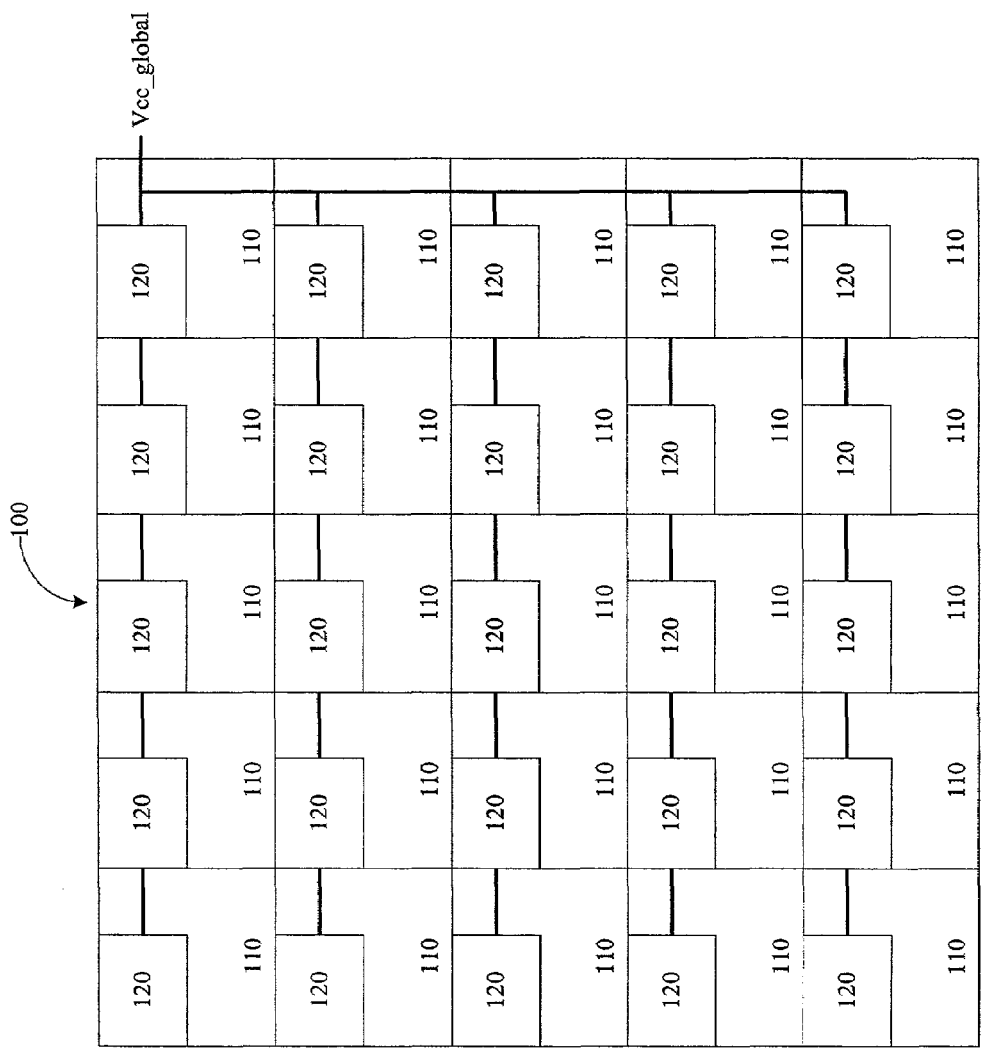
FIG. 1 is a block diagram of one embodiment of an integrated circuit.

FIG. 1 is a block diagram of one embodiment of an IC 100. According to one embodiment, IC 100 is partitioned into twenty-five circuit blocks 110. In a further embodiment, each circuit block 110 includes a voltage differentiator 120. Each voltage differentiator 120 generates a local power supply ($V_{CC\_local}$) from an external power supply ($V_{CC\_global}$).

In one embodiment, differentiator 120 dynamically changes $V_{CC\_local}$ based upon the operation status of the particular circuit block 110 in which the differentiator 120 is included. One of ordinary skill in the art will appreciate that other quantities of circuit blocks 110 may be implemented within IC 100.

Figure 2:
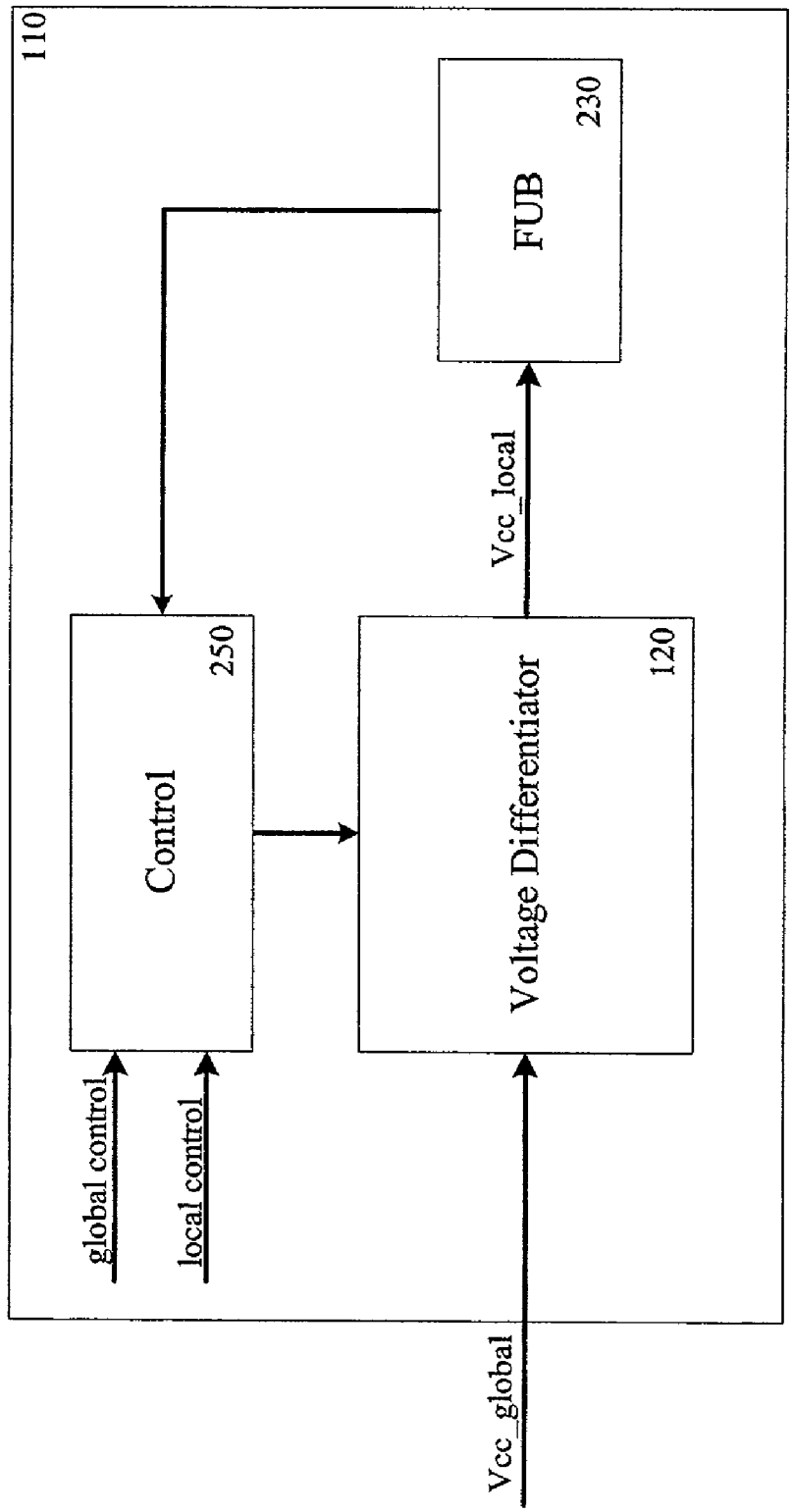
FIG. 2 is a block diagram of one embodiment of a circuit block.

FIG. 2 is a block diagram of one embodiment of a circuit block 110. Circuit block 110 includes voltage differentiator 120, a functional unit block (FUB) 230 and a control module 250. FUB 230 is coupled to voltage differentiator 120. In one embodiment, FUB 230 is logic circuitry that may encompass various components within IC 100 (e.g., microprocessor logic, microcontroller logic, memory logic, etc.). FUB 230 is powered by $V_{CC\_local}$ received from voltage differentiator 120.

Control module 250 is coupled to voltage differentiator 120 and FUB 230. According to one embodiment, control module 250 transmits a binary encoded signal to voltage differentiator 120 that is used to scale the local operating voltage generated at voltage differentiator 120. In a further embodiment, control module 250 transmits either a local control signal or a global control signal. In yet another embodiment, the global control signal overrides the local control signal.

Figure 3:
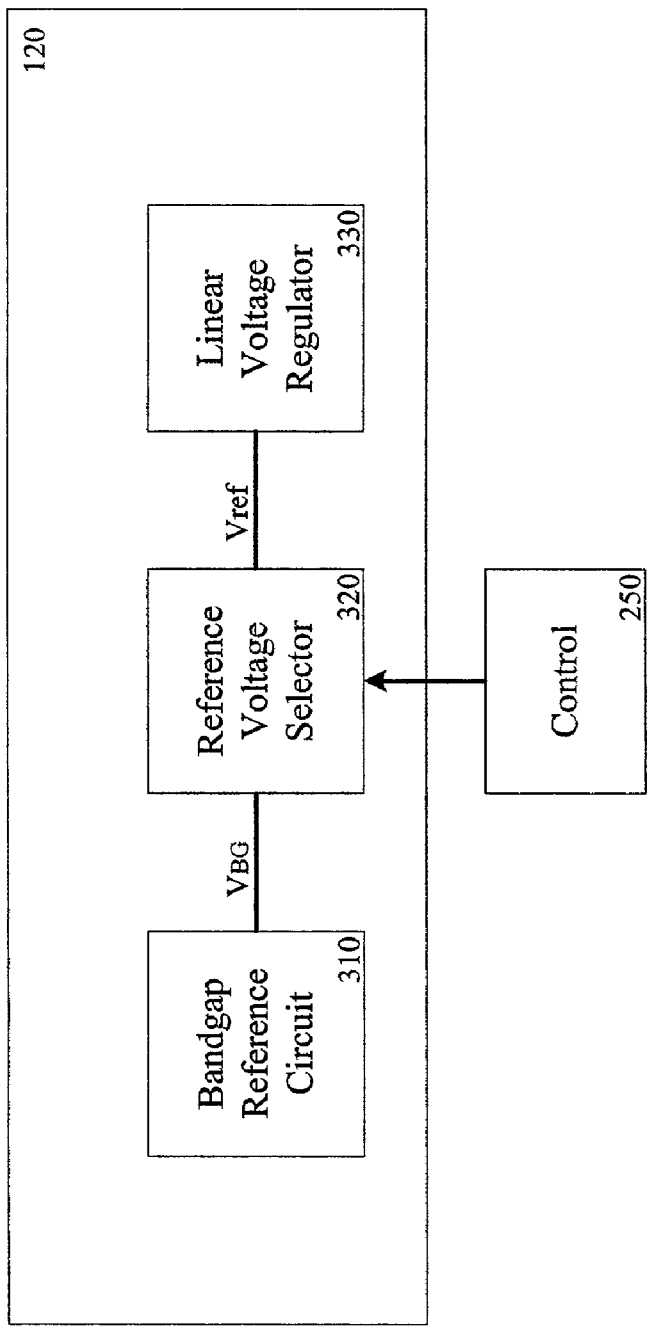
FIG. 3 illustrates one embodiment of a voltage differentiator.

FIG. 3 illustrates one embodiment of voltage differentiator 120 coupled to control module 250. Voltage differentiator 120 includes bandgap reference circuit 310, reference voltage selector 320 and linear voltage regulator 330. Bandgap reference circuit 310 generates a bandgap reference voltage $V_{BG}$. In one embodiment, $V_{BG}$ is a stable voltage source that is insensitive to temperature and process variations.

Figure 4:
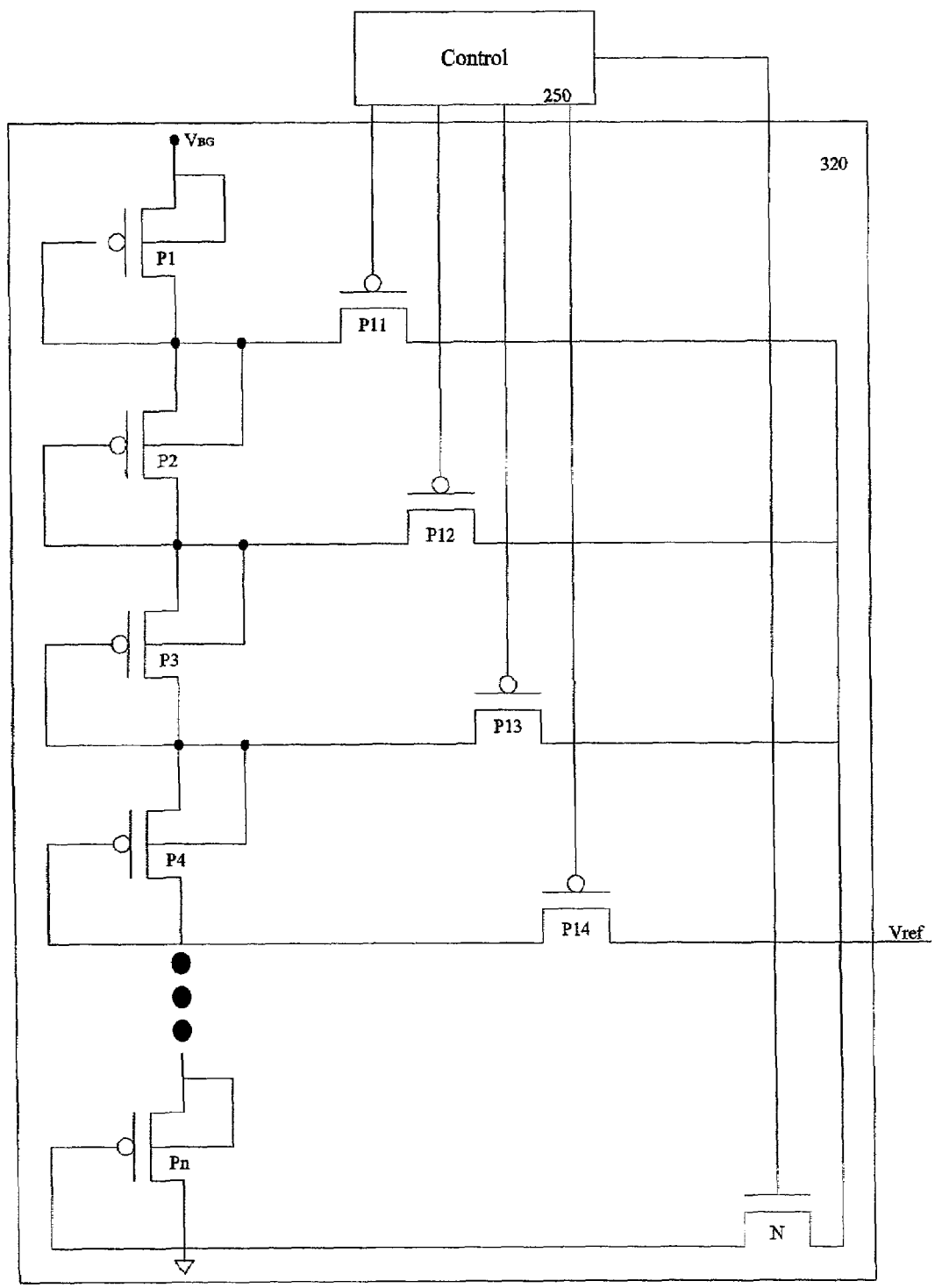
FIG. 4 illustrates one embodiment of a reference voltage selector.

Reference voltage selector 320 is coupled to bandgap reference circuit 310 and control module 250. Reference voltage selector 320 generates a reference voltage ($V_{REF}$) for linear voltage regulator 330. FIG. 4 illustrates one embodiment of reference voltage selector 320. Reference voltage selector 320 includes PMOS voltage divider transistors P1–Pn, PMOS pass transistors P11–Pn-1 and a NMOS transistor N. According to one embodiment, up to n–1 voltage levels can be selected. For instance, if four voltage levels are needed, four PMOS pass transistors P11–P14 are used.

In one embodiment, voltage divider transistors P1–Pn are series connected transistors that provide a variable resistance to $V_{BG}$ received from bandgap reference circuit 310 in order to generate $V_{REF}$. For instance, if the number of transistors in the voltage divider is n, the granularity of $V_{REF}$ is $V_{BG}/n$.

In one embodiment, $V_{REF}$ is determined by the encoded control signal received at transistors P11–P14 from control module 250. The received signal is determined by the operation status of FUB 230. For example, if a relatively high $V_{REF}$ is needed, the binary control signal 01110 is received at transistors P11–P14 and transistor N, respectively. As a result, only transistor P11 is activated and $V_{REF}$ is equal to $V_{BG}*(1-1/n)$, where n is the number of transistors in the voltage divider. Similarly, $V_{REF}$ is equal to $V_{BG}*(1-$ 2/n), $V_{BG}*(1-3/n)$ and $V_{BG}*(1-4/n)$ when the control signal is 10110, 11010, 11100, respectively.

According to one embodiment, the value of $V_{CC\_local}$ changes dynamically based upon the activity of the corresponding FUB 230. For instance, if a FUB 230 requires a relatively high voltage, a higher $V_{REF}$ is generated by reference voltage selector 320. Consequently, a higher $V_{CC\_local}$ is generated by line voltage regulator 330. Conversely, if a FUB 230 requires a relatively low voltage, lower $V_{REF}$ and $V_{CC\_local}$ voltages are generated.

In a further embodiment, a higher $V_{REF}$ may be needed to satisfy performance requirements for circuit blocks 110 that are in a critical path. However, for other circuit blocks 110 that are not in a critical path, a lower $V_{REF}$ can be selected to reduce power dissipation. In a further embodiment, control module 250 may cause circuit block 110 to enter a standby mode by transmitting 11111 as the control signal. In such an instance, only transistor N is activated, and a $V_{REF}$ of 0V is transmitted to linear voltage regulator 330.

Figure 5:
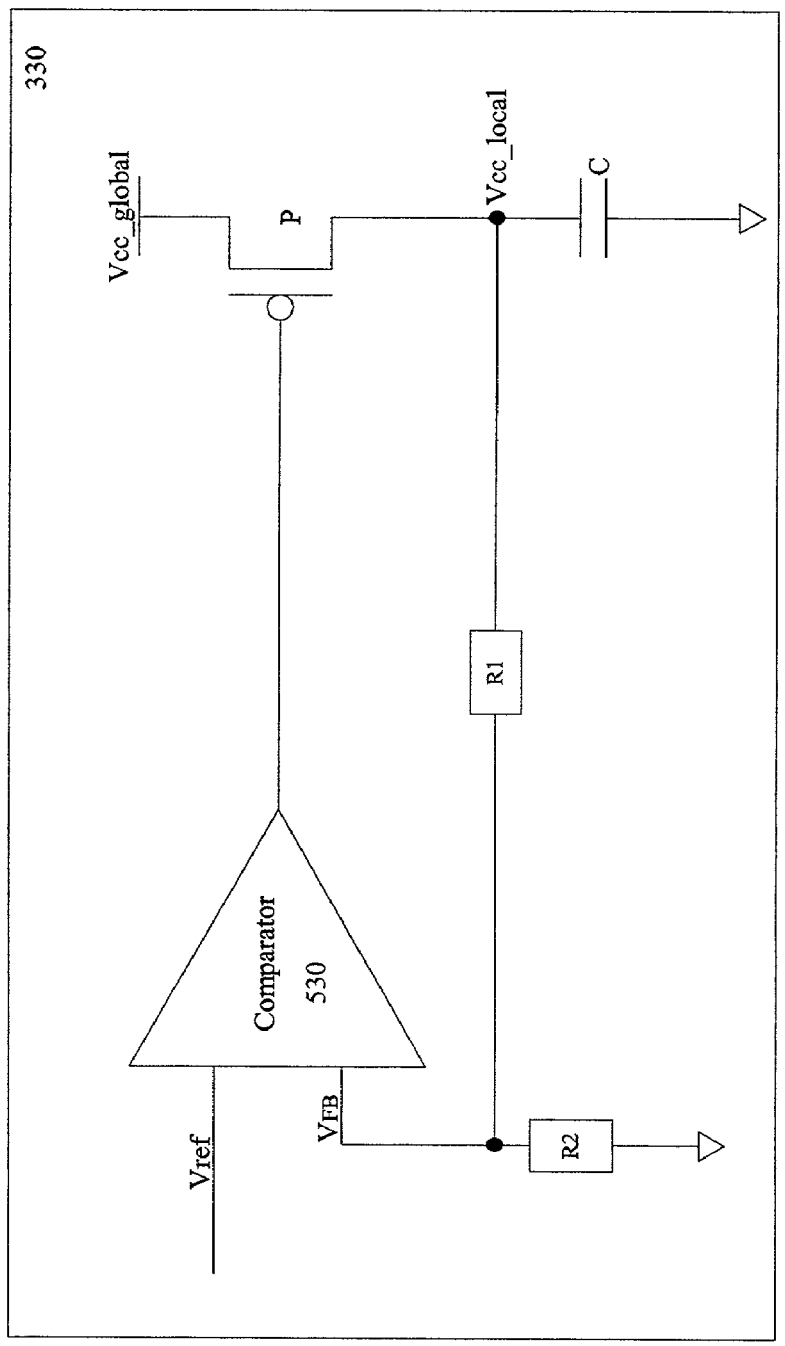
FIG. 5 illustrates one embodiment of a linear voltage regulator.

Referring back to FIG. 3, linear voltage regulator 330 generates $V_{CC\_local}$ for circuit block 110. FIG. 5 illustrates one embodiment of linear voltage regulator 330. Linear voltage regulator 330 includes a comparator 530, a PMOS transistor (P), resistors R1 and R2 and a capacitor. Comparator compares the $V_{REF}$ received from reference voltage selector 320 with a feedback voltage ($V_{FB}$) received from transistor P through resistors R1 and R2.

If $V_{FB}$ falls below $V_{REF}$, the output of comparator 530 is activated at a low logic level (e.g., logic 0). Otherwise, the output of comparator 530 remains at high logic level (e.g., logic 1). According to one embodiment, comparator 530 is an operational amplifier. However, one of ordinary skill in the art will recognize that other comparison logic circuitry may be used to implement comparator 530.

The output of comparator 530 is coupled to the gate of transistor P. The source of transistor P is coupled to $V_{CC\_global}$, while the drain is coupled to resistor R1, the capacitor and FUB 230 through $V_{CC\_local}$. Transistor P is activated whenever comparator 530 is activated to logic 0.

Resistor R1 is coupled to resistor R2 and comparator 530. Resistors R1 and R2 are used to generate $V_{FB}$ for comparator 530. Resistors R1 and R2, and the generation of $V_{FB}$, help to control the output of linear voltage regulator 330 by providing a larger voltage range. However, one of ordinary skill in the art will appreciate that resistors R1 and R2 are not necessary to implement linear voltage regulator 330.

As described above, the value of $V_{CC\_local}$ changes dynamically based upon the activity of the corresponding FUB 230. During the active mode, transistor P is activated whenever $V_{FB}$ falls below $V_{REF}$. In particular, comparator 530 senses such a condition and is activated to logic 0. Consequently, the gate of transistor P is activated to logic 0. Transistor P charges the decouple capacitor, thus increasing $V_{CC\_local}$. In the active mode, linear voltage regulator 330 generates $V_{CC\_local}=V_{REF}*(1+R1/R2)$.

During the standby mode, $V_{REF}$ is 0. Accordingly, $V_{FB}$ is always greater than or equal to $V_{REF}$, and the output of the comparator is logic 1 and transistor P is turned off. As a result, $V_{CC\_local}$ is floating to reduce the leakage power at circuit block 110.

The use of on-die voltage differentiators enables the generation of a local power supply voltage for each circuit block within an IC. The local power supply voltage changes dynamically based on the activity of the corresponding circuit block. This reduces the power dissipation while maintaining performance. Moreover, the dynamic voltage scaling mechanism using on-die voltage differentiator has a standby control capability, which can drastically reduce leakage power during idle time for a circuit block.

Whereas many alterations and modifications of the present invention will no doubt become apparent to a person of ordinary skill in the art after having read the foregoing description, it is to be understood that any particular embodiment shown and described by way of illustration is in no way intended to be considered limiting. Therefore, references to details of various embodiments are not intended to limit the scope of the claims which in themselves recite only those features regarded as the invention.

What is claimed is:

1. An integrated circuit comprising:
   a first circuit block having a first voltage differentiator to generate a first power supply to provide power to the first circuit block; and
   a second circuit block having a second voltage differentiator to generate a second power supply to provide power to the second circuit block.

2. The integrated circuit of claim 1 wherein the first and second voltage differentiators dynamically modify the first power supply and the second power supply based upon the operation status of the corresponding circuit block.

3. The integrated circuit of claim 2 wherein the first and second circuit blocks operates in a standby mode whenever the first and second voltage differentiators switch off the first and second power supplies.

4. The integrated circuit of claim 1 wherein the first circuit block comprises:
   a first functional unit block (FUB) coupled to the first voltage differentiator; and
   a first control module, coupled to the first voltage differentiator and the first FUB, to determine the operation mode for the first circuit block.

5. The integrated circuit of claim 4 wherein the control module generates a binary encoded signal that is transmitted to the first voltage differentiator to indicate the voltage magnitude of the local power supply.

6. The integrated circuit of claim 5 wherein the first voltage differentiator comprises:
   a bandgap reference circuit that generates a bandgap voltage;
   a reference voltage selector, coupled to the bandgap reference circuit and the control module, that generates a reference voltage based upon the received bandgap voltage; and
   a linear voltage regulator, coupled to the reference voltage selector, that generates the local power supply based upon the received reference voltage.

7. The integrated circuit of claim 6 wherein the reference voltage selector comprises:
   a plurality of voltage divider transistors that divide the bandgap voltage to generate the reference voltage; and
   a plurality of pass transistors, coupled to the control module, that select a reference voltage based upon the received signal received from the control module.

8. The integrated circuit of claim 6 wherein the linear voltage regulator comprises:
   a comparator, coupled to the reference voltage selector, that compares the reference voltage to the local power supply voltage;
   a PMOS transistor having a gate coupled to the output of the comparator and a drain coupled to the FUB; and
   a capacitor coupled to the drain of the PMOS transistor.

9. The integrated circuit of claim 8 wherein the linear voltage regulator comprises:
   a first resistor coupled to the drain of the PMOS transistor; and
   a second resistor coupled to the first resistor, the comparator and ground.

10. The integrated circuit of claim 8 wherein the comparator comprises an operational amplifier.

11. The integrated circuit of claim 4 wherein the second circuit block comprises:
   a second FUB coupled to the second voltage differentiator; and
   a second control module, coupled to the second voltage differentiator and the second FUB, to determine the operation mode for the second circuit block.

12. A circuit block within an integrated circuit, the circuit block comprising:
   a control module to determine the operation mode for the circuit block;
   a functional unit block (FUB) coupled to the control module; and
   a voltage differentiator, coupled to the control module and the FUB, to dynamically modify the local power supply for the circuit block based upon the operation mode.

13. The circuit block of claim 12 wherein the circuit block operates in a standby mode whenever the voltage differentiator switches off the local power supply.

14. The circuit block of claim 12 wherein the control module generates a binary encoded signal that is transmitted to the voltage differentiator to indicate the voltage magnitude of the local power supply.

15. The circuit block of claim 14 wherein the voltage differentiator comprises:
   a bandgap reference circuit that generates a bandgap voltage;
   a reference voltage selector, coupled to the bandgap reference circuit and the control module, that generates a reference voltage based upon the received bandgap voltage; and
   a linear voltage regulator, coupled to the reference voltage selector, that generates the local power supply based upon the received reference voltage.

16. The circuit block of claim 15 wherein the reference voltage selector comprises:
   a plurality of voltage divider transistors that divide the bandgap voltage to generate the reference voltage; and
   a plurality of pass transistors, coupled to the control module, that select a reference voltage based upon the received signal received from the control module.

17. The circuit block of claim 15 wherein the linear voltage regulator comprises:
   a comparator, coupled to the reference voltage selector, that compares the reference voltage to the local power supply voltage;
   a PMOS transistor having a gate coupled to the output of the comparator and a drain coupled to the FUB; and
   a capacitor coupled to the drain of the PMOS transistor.

18. The circuit block of claim 17 wherein the linear voltage regulator comprises:
   a first resistor coupled to the drain of the PMOS transistor; and
   a second resistor coupled to the first resistor, the comparator and ground.

19. The circuit block of claim 18 wherein the comparator comprises an operational amplifier.

20. A voltage differentiator comprising:
   a bandgap reference circuit that generates a bandgap voltage;
   a reference voltage selector, coupled to the bandgap reference circuit and the control module, that generates a reference voltage based upon the received bandgap voltage; and
   a linear voltage regulator, coupled to the reference voltage selector, that generates a local power supply based upon the received reference voltage.

21. The voltage differentiator of claim 20 wherein the reference voltage selector comprises:
   a plurality of voltage divider transistors that divide the bandgap voltage to generate the reference voltage; and
   a plurality of pass transistors, coupled to the control module, that select a reference voltage based upon the received signal received from the control module.

22. The voltage differentiator of claim 20 wherein the linear voltage regulator comprises:
   a comparator, coupled to the reference voltage selector, that compares the reference voltage to the local power supply voltage;
   a PMOS transistor having a gate coupled to the output of the comparator and a drain coupled to the FUB; and
   a capacitor coupled to the drain of the PMOS transistor.

23. The voltage differentiator of claim 22 wherein the linear voltage regulator comprises:
   a first resistor coupled to the drain of the PMOS transistor; and
   a second resistor coupled to the first resistor, the comparator and ground.

* * * * *